(12) United States Patent
Cho et al.

(10) Patent No.: US 10,381,217 B2
(45) Date of Patent: Aug. 13, 2019

(54) METHOD OF DEPOSITING A THIN FILM

(71) Applicant: WONIK IPS CO., LTD., Pyeongtaek-si Gyeonggi-do (KR)

(72) Inventors: Byung Chul Cho, Hwaseong-si (KR); Sang Jin Lee, Pyeongtaek-si (KR); In Hwan Yi, Suwon-si (KR); Kwang Seon Jin, Incheon (KR)

(73) Assignee: WONIK IPS CO., LTD., Pyeongtaek-si, Gyeonnggi (KR)

( * ) Notice: Subject to any disclaimer, the term of this patent is extended or adjusted under 35 U.S.C. 154(b) by 0 days.

(21) Appl. No.: 15/816,430

(22) Filed: Nov. 17, 2017

(65) Prior Publication Data

US 2018/0166270 A1    Jun. 14, 2018

(30) Foreign Application Priority Data

Dec. 9, 2016  (KR) .................... 10-2016-0167401

(51) Int. Cl.
*H01L 21/02* (2006.01)
*C23C 16/455* (2006.01)
*C23C 16/04* (2006.01)
*H01L 21/32* (2006.01)

(52) U.S. Cl.
CPC ........ *H01L 21/0228* (2013.01); *C23C 16/045* (2013.01); *C23C 16/45527* (2013.01); *C23C 16/45534* (2013.01); *H01L 21/02112* (2013.01); *H01L 21/02126* (2013.01); *H01L 21/02142* (2013.01); *H01L 21/02164* (2013.01); *H01L 21/02274* (2013.01); *H01L 21/02642* (2013.01); *H01L 21/32* (2013.01); *H01L 21/0243* (2013.01); *H01L 21/02639* (2013.01)

(58) Field of Classification Search
CPC ........ H01L 21/02112; H01L 21/02126; H01L 21/02164; H01L 21/0217; H01L 21/02172; H01L 21/02208; H01L 21/02271; H01L 21/0228; H01L 21/02642; H01L 21/32; C23C 16/045; C23C 16/45525; C23C 16/45534; C23C 16/45553
See application file for complete search history.

(56) References Cited

U.S. PATENT DOCUMENTS

2016/0163556 A1* 6/2016 Briggs .............. H01L 21/30655
                                                              438/696
2017/0175266 A1* 6/2017 Kumagai .......... C23C 16/45544

* cited by examiner

*Primary Examiner* — Stephen W Smoot
(74) *Attorney, Agent, or Firm* — William Park & Associates Ltd.

(57) ABSTRACT

In a method of deposition a thin film, a substrate having a pattern may be provided. A surface of the substrate may be treated using a deposition-suppressing gas to form a deposition-suppressing layer on the pattern. A process gas may be applied to the pattern to deposit the thin film. The deposition-suppressing gas may include fluorine.

14 Claims, 6 Drawing Sheets

METHOD OF DEPOSITING A THIN FILM

CROSS-REFERENCES TO RELATED APPLICATION

The present application claims priority under 35 U.S.C. § 119(a) to Korean application number 10-2016-0167401, filed on Dec. 9, 2016, in the Korean Intellectual Property Office, which is incorporated herein by reference in its entirety.

BACKGROUND

1. Technical Field

Various embodiments generally relate to a method of manufacturing a semiconductor device, more particularly a method of depositing a thin film.

2. Related Art

A semiconductor device may include numerous electronic elements formed on a semiconductor substrate.

A deposition process in manufacturing the semiconductor device may be a process for physically forming a conductive layer, an insulating layer, a semiconductor layer, etc., on the semiconductor substrate.

The deposition process may include an atomic layer deposition (ALD) process and a chemical vapor deposition (CVD) process.

In the CVD process, two gases may be reacted with each other to form a thin film. The CVD process may include a low pressure CVD (LPCVD) process, a plasma enhanced CVD (PECVD) process, etc. In the ALD process, atoms may be deposited by each layer. The ALD process may be used in a process for forming a fine pattern.

A precursor may be a ligand binding material with a metal. As the semiconductor process may have been fined, the deposition process using the precursor may be widely used.

However, a design rule of the semiconductor device may be continuously decreased. A method of deposition a thin film having to characteristics required in the design rule may be required.

SUMMARY

In an embodiment, in a method of deposition a thin film, a substrate having a pattern may be provided. A surface of the substrate may be treated using a deposition-suppressing gas to form a deposition-suppressing layer on the pattern. A process gas may be applied to the pattern to deposit the thin film. The deposition-suppressing gas may include fluorine.

DETAILED DESCRIPTION

Hereinafter, example embodiments will be described below with reference to the accompanying drawings through various examples of embodiments.

Figure 1:
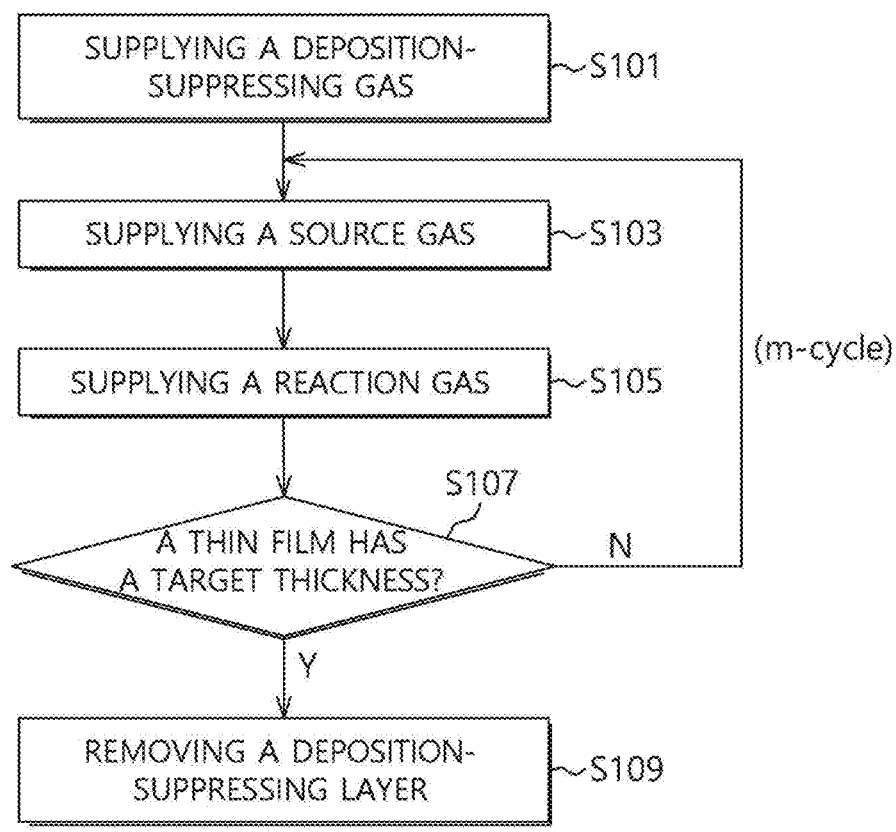
FIG. 1 is a flow chart illustrating a method of depositing a thin film in accordance with example embodiments.

FIG. 1 is a flow chart illustrating a method of depositing a thin film in accordance with example embodiments, and FIGS. 2A to 2E are cross-sectional views illustrating a method of depositing a thin film in accordance with example embodiments.

Figure 2A:
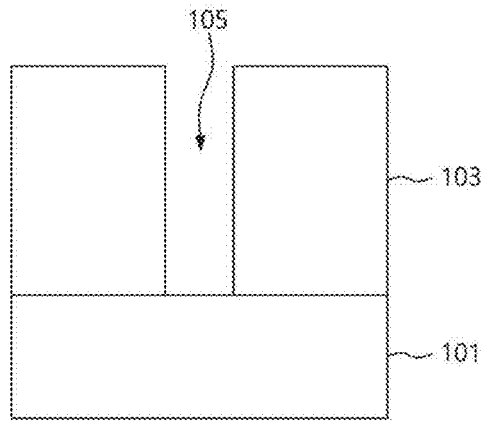
FIGS. 2A to 2E are cross-sectional views illustrating a method of depositing a thin film in accordance with example embodiments.

Referring to FIG. 2A, a substrate 201 having a structure 103 may be loaded into a deposition chamber.

In example embodiments, the structure 103 may include a pattern having an aspect ratio such as a via hole, a trench, a contact hole, etc. In this case, the structure 103 may include a hole 105.

In order to deposit a thin film on a desired region of the substrate 101, in step S101, a deposition-suppressing gas may be supplied into the deposition chamber. After supplying the deposition-suppressing gas, the deposition chamber may be purged.

In example embodiments, when the thin film may include a metal organic compound including silicon, the deposition-suppressing gas may include a precursor including fluorine.

The precursor including fluorine may include at least one of oxygen (O), carbon (C), hydrogen (H) and nitrogen (N). For example, the precursor including fluorine may be selected from groups including $NF_3$, $F_2$, $CF_4$ and CHF. However, the precursor including fluorine may not be restricted within the groups.

Figure 2B:
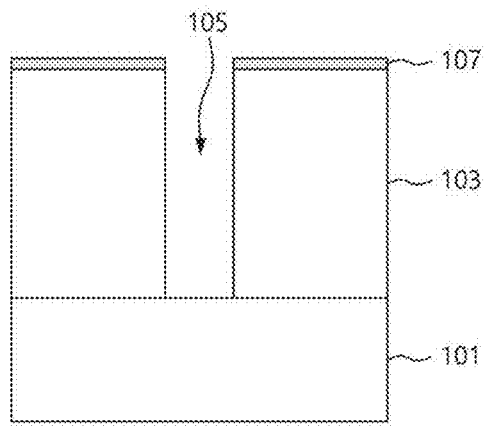
Figure 2C:
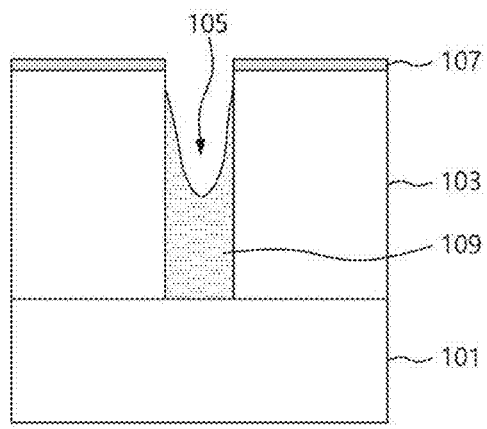

Referring to FIG. 2B, a deposition-suppressing layer 107 may be formed on a region of the substrate 101, i.e., a deposition avoidance region on which the thin film may not be formed. For example, the deposition-suppressing layer 107 may be formed on an upper surface of the structure 103. A flux, a supplying time, a supplying pressure, etc., of the deposition-suppressing gas introduced into the deposition chamber may be controlled.

The deposition-suppressing gas may function as to change the surface of the substrate 101 into a hydrophobic material including fluorine. A deposition precursor, for example, a silicon precursor may not be attached to the hydrophobic surface of the substrate 101.

After the surface treatment process for forming the deposition-suppressing layer 107 on the deposition avoidance region, the thin film may be formed on a deposition region of the substrate 101 on which the deposition-suppressing layer 107 may not be formed. The thin film may be formed by an ALD process.

Particularly, in step S103, the deposition precursor, i.e., a first process gas corresponding to a source gas may be supplied to the deposition chamber. The deposition precursor may be adsorbed on the deposition region. The deposition chamber may then be purged.

When the thin film may include a metal organic compound, the deposition precursor may include a metal organic precursor.

In step S105, a second process gas may be supplied to the deposition chamber. The second process gas may be reacted with the first process gas adsorbed on the deposition region to form the thin film on the deposition region on which the deposition-suppressing layer 107 may not be formed. For example, the thin film 109 may be formed in the hole 105. The deposition chamber may then be purged.

In example embodiments, the first process gas may include silicon. The second process gas may include $O_2$ plasma, $H_2O$, $H_2O_2$ or $O3$. Alternatively, the second process gas may include $NH_3$ or $N_2$.

In step S107, the process for depositing the thin film by supplying the source gas in step S103 and by supplying the reaction gas in step S105 may be a cyclic deposition process for repeating the steps S103 and S105 by predetermined cycle (m-cycle) to provide the thin film 109 with a target thickness.

Figure 2D:
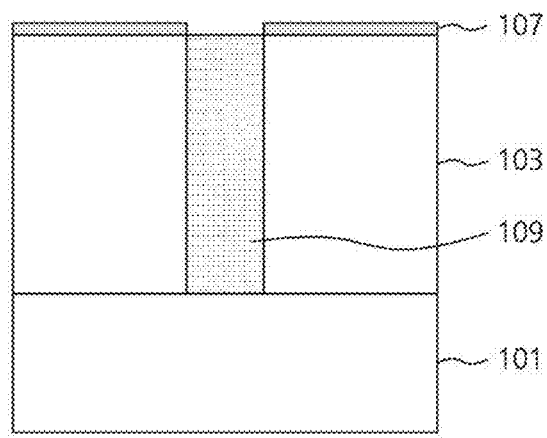

Thus, referring to FIG. 2D, the thin film 109 on the deposition region may have the target thickness. In example embodiments, the thin film 109 may have a thickness for fully filling the hole 105.

Figure 2E:
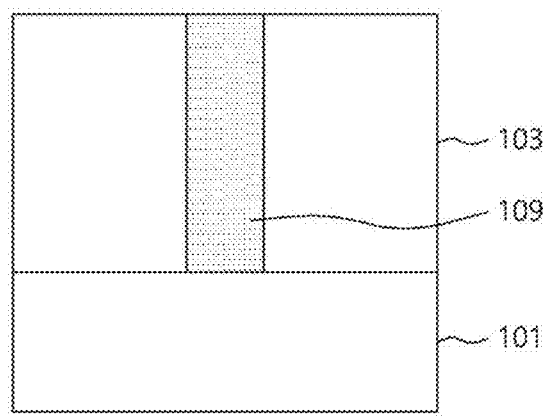

In step S109, the deposition-suppressing layer 107 on the deposition avoidance region may be removed to form a semiconductor device in FIG. 2E.

In example embodiments, the deposition-suppressing layer 107 may be removed using a reducing agent or a plasma treatment. The reducing agent may include a hydroxyl group. The reducing agent may include other groups. The plasma treatment may use argon. The plasma treatment may use other gases.

According to example embodiments, when the hole may be buried, the deposition-suppressing layer may be formed on the pattern. The source gas and the reaction gas may be reacted with each other to form the thin film in the hole. Thus, the hole may be filled with the thin film so that the thin film may not have a void or a seam.

Figure 3:
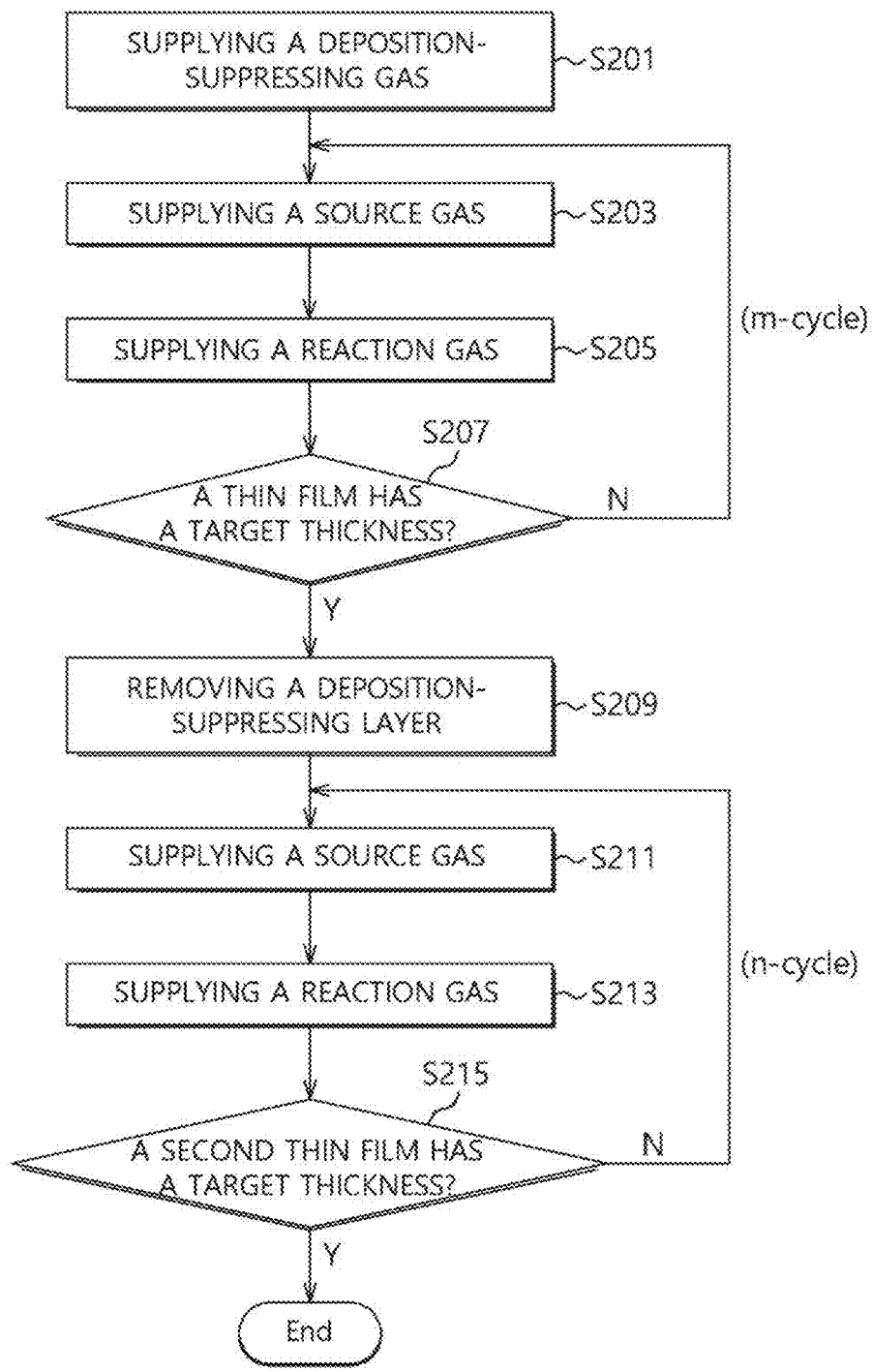
FIG. 3 is a flow chart illustrating a method of depositing a thin film in accordance with example embodiments.
Figure 4A:
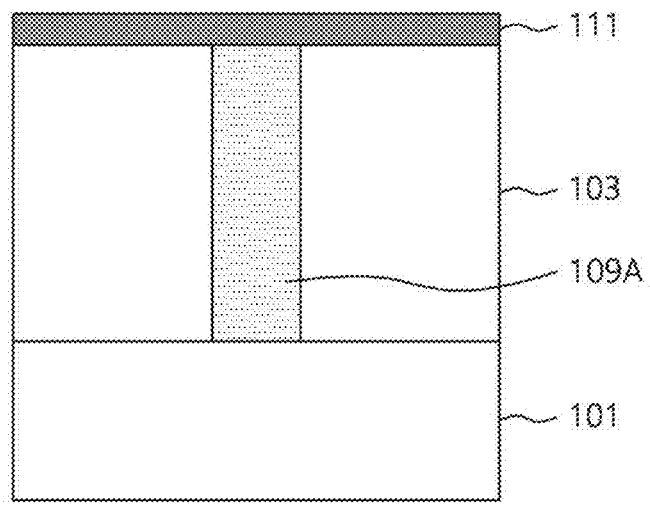
FIGS. 4A and 4B are cross-sectional views illustrating a method of depositing a thin film in accordance with example embodiments.
Figure 4B:
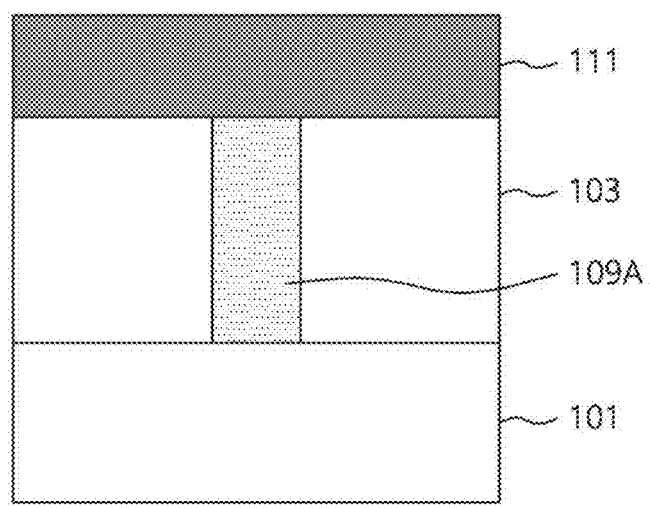

FIG. 3 is a flow chart illustrating a method of depositing a thin film in accordance with example embodiments, and FIGS. 4A and 4B are cross-sectional views illustrating a method of depositing a thin film in accordance with example embodiments.

A substrate 101 having a structure 103 may be provided. The structure 103 may include a pattern having an aspect ratio.

Processes of steps S201-209 may be performed on the substrate to deposit a first thin film 109A on a deposition region in FIG. 2E.

The processes of steps S201-209 may be substantially the same as the processes of step S101-109. Thus, any further illustrations with respect to the processes of steps S201-209 may be omitted herein for brevity.

After forming the first thin film 109A in the hole and removing the deposition-suppressing layer 107, in step S211, a first process gas corresponding to a source gas as a deposition precursor may be supplied to the deposition chamber. The source gas may be adsorbed on the structure 103 and the first thin film 109A. The deposition chamber may then be purged.

In step S213, a second process gas corresponding to a reaction gas may be supplied to the deposition chamber. The second process gas may be reacted with the first process gas. The deposition chamber may then be purged.

Thus, as shown in FIG. 4A, a second thin film 111 may be formed on structure 103 and the first thin film 109A.

In step S215, the process for depositing the second thin film by supplying the source gas in step S211 and by supplying the reaction gas in step S213 may be a cyclic deposition process for repeating the steps S211 and S213 by predetermined cycle (n-cycle) to provide the second thin film 111 with a target thickness.

Therefore, as shown in FIG. 4B, the second thin film 111 may have the target thickness. In example embodiments, the second thin film 111 may include a material substantially the same as that of the first thin film 109A. Alternatively, the second thin film 111 may include a material different from that of the first thin film 109A.

According to example embodiments, after filling the hole with the first thin film, the second thin film may be formed on the structure.

Because the hole may be fully filled with the first thin film before forming the second thin film, the semiconductor device may have improved yield and reliability.

FIG. 5 is cross-sectional views and a graph showing a deposition rate difference of a thin film in accordance with distributions and positions of a deposition-suppressing gas.

Referring to FIG. 5, deposition rates of a thin film 205, for example, a silicon oxide layer may be different from each other in accordance with distributions and positions of the deposition-suppressing gas 203 on the pattern 201.

Figure 5A:
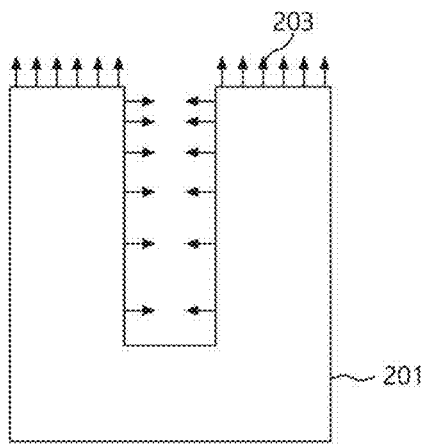
FIG. 5A to 5E are cross-sectional views and a graph showing a deposition rate difference of a thin film in accordance with distributions and positions of a deposition-suppressing gas.

As shown in FIG. 5A, a supplying amount of the deposition-suppressing gas 203 to the upper surface of the pattern 201 may be greater than that of the deposition-supplying gas 203 to the hole. The distribution of the deposition-suppressing gas 203 on the pattern 201 may be changed by controlling a supplying time or a supplying amount.

Figure 5B:
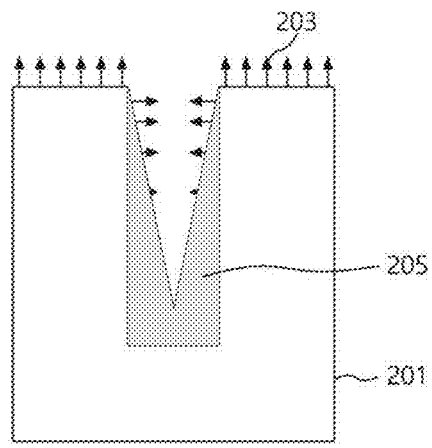
Figure 5C:
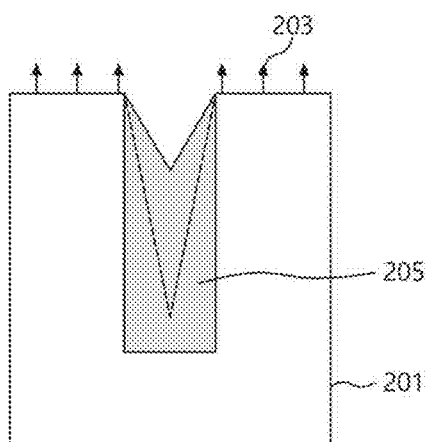
Figure 5D:
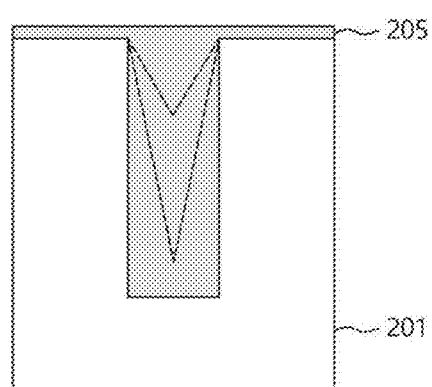

In this case, as shown in FIG. 5B, the thin film 205 may be first deposited in an inner region of the pattern 203 on which the deposition-suppressing gas may be distributed relatively less. As shown in FIG. 5C, the thin film 205 may be sequentially formed in the pattern by continuously performing the deposition process.

The supplying amount of the deposition-suppressing gas 203 may be decreased. Alternatively, the deposition-suppressing gas 203 on the pattern 201 may be removed. When the deposition process may then be continuously performed, a growing rate of the thin film 205 may be increased to form the thin film 205 having a target thickness on the pattern 201. Therefore, the thin film 205 may not have a seam or a void.

Figure 5E:
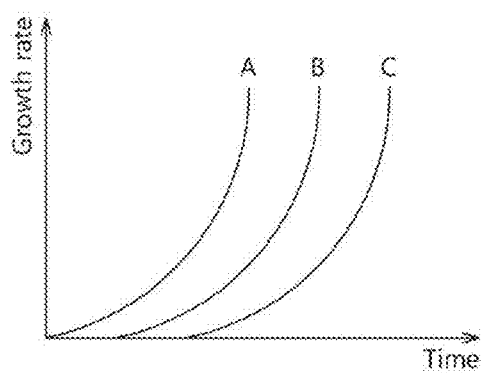

FIG. 5E is a graph showing a deposition rate of the thin film 205 in accordance with a time. It can be noted that a deposition rate A of the thin film 205 on a bottom surface in the pattern 201 on which the deposition-suppressing gas 203 may not be formed, a deposition rate B of the thin film 205 on an inner upper region in the pattern 201 on which the deposition-suppressing gas 203 may be formed, and a deposition rate C of the thin film 205 on an upper surface of the pattern 201 on which a great amount of the deposition-suppressing gas 203 may be formed may be different from each other. That is, it can be noted that the deposition rate of the thin film 205 may be inversely proportional to the attached amount of the deposition-suppressing gas 203.

In example embodiments, the thin film may be deposited by repeating the process for supplying the deposition-suppressing gas, the purge process, the process for supplying the first process gas and the process for supplying the second process gas without the process for removing the deposition-suppressing layer.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A method of depositing to a thin film, the method comprising:

providing a substrate having a pattern;

treating a surface of the substrate using a deposition-suppressing gas including fluorine to form a deposition-suppressing layer on the pattern to suppress depositing a first thin film;

forming the first thin film using a process gas on the substrate;

removing the deposition-suppressing layer; and depositing a second thin film on the first thin film and the pattern by predetermined N-cycle.

2. The method of claim 1, wherein the pattern comprises a via hole, a trench or a contact hole having an aspect ratio.

3. The method of claim 1, wherein forming the first thin film comprises:

providing the pattern with a first process gas to adsorb the first process gas on the pattern;

purging the first process gas;

providing the pattern with a second process gas to react the first process gas with the second process gas; and purging the second process gas.

4. The method of claim 3, wherein the first process gas comprises a metal organic compound including silicon.

5. The method of claim 3, wherein the second process gas comprises $O_2$ plasma, $H_2O$, $H_2O_2$ or O3.

6. The method of claim 3, wherein the second process gas comprises $NH_3$ or $N_2$.

7. The method of claim 1, wherein the deposition-suppressing gas further comprises at least one of oxygen, carbon, hydrogen and nitrogen.

8. The method of claim 1, wherein the deposition-suppressing gas comprises $NF_3$, $F_2$, $CF_4$ or CHF.

9. The method of claim 1, wherein the process for treating the surface of the substrate and the process for forming the first thin film are repeatedly performed a plurality of times.

10. The method of claim 9, wherein the treating the surface of the substrate is once performed, and the forming the first thin film comprises a first cyclic deposition process for repeatedly depositing the first thin film.

11. The method of claim 1, wherein the removing the deposition-suppressing layer comprises triggering a reduction reaction using a reducing agent including a hydroxyl group.

12. The method of claim 1, wherein removing the deposition-suppressing layer comprising treating with a plasma using argon.

13. The method of claim 1, wherein the second thin film comprises a material substantially the same as that of the first thin film.

14. The method of claim 1, wherein the second thin film comprises a material different from that of the first thin film.

* * * * *